United States Patent
Miyazaki

(10) Patent No.: US 11,031,416 B2
(45) Date of Patent: Jun. 8, 2021

(54) SEMICONDUCTOR STORAGE DEVICE AND METHOD FOR MANUFACTURING SEMICONDUCTOR STORAGE DEVICE

(71) Applicant: TOSHIBA MEMORY CORPORATION, Minato-ku (JP)

(72) Inventor: Maki Miyazaki, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 9 days.

(21) Appl. No.: 16/564,381

(22) Filed: Sep. 9, 2019

(65) Prior Publication Data
US 2020/0303407 A1    Sep. 24, 2020

(30) Foreign Application Priority Data

Mar. 18, 2019    (JP) .............................. JP2019-050385

(51) Int. Cl.
*H01L 27/11582*    (2017.01)
*H01L 27/11524*    (2017.01)
(Continued)

(52) U.S. Cl.
CPC .. *H01L 27/11582* (2013.01); *H01L 21/76816* (2013.01); *H01L 21/76877* (2013.01);
(Continued)

(58) Field of Classification Search
CPC ......... H01L 27/11582; H01L 27/11524; H01L 27/11556; H01L 21/76877; H01L 23/5226; H01L 23/5283; H01L 21/76816; H01L 27/1157; H01L 27/11575; H01L 27/11573; H01L 27/112–11597;
(Continued)

(56) References Cited

U.S. PATENT DOCUMENTS 9,947,620 B2    4/2018  Shinohara
2015/0214103 A1    7/2015  Matsuda
(Continued)

FOREIGN PATENT DOCUMENTS

JP    6129756 B2    5/2017
JP    2017-135238 A    8/2017
(Continued)

*Primary Examiner* — Shahed Ahmed
(74) *Attorney, Agent, or Firm* — Oblon, McClelland, Maier & Neustadt, L.L.P.

(57) ABSTRACT

According to one embodiment, a semiconductor storage device includes: a first stacked body in which a plurality of conductive layers are stacked via a first insulating layer, the first stacked body having a first stepped portion and a second stepped portion in which end portions of the plurality of conductive layers are formed in a step shape in a lower layer; a second stacked body in which a plurality of second insulating layers are stacked via a third insulating layer, the second stacked body having a third stepped portion in which end portions of the plurality of second insulating layers in an identical level as the conductive layers forming the first stepped portion are formed in a step shape. The first stepped portion and the third stepped portion oppose each other, and the second stepped portion and the third stepped portion overlap each other at least partially in a top view.

10 Claims, 16 Drawing Sheets

(51) Int. Cl.
    *H01L 27/11556*    (2017.01)
    *H01L 21/768*      (2006.01)
    *H01L 23/522*      (2006.01)
    *H01L 23/528*      (2006.01)
    *H01L 27/1157*     (2017.01)

(52) U.S. Cl.
    CPC ...... *H01L 23/5226* (2013.01); *H01L 23/5283* (2013.01); *H01L 27/1157* (2013.01); *H01L 27/11524* (2013.01); *H01L 27/11556* (2013.01)

(58) Field of Classification Search
    CPC ... H01L 2924/145–1453; H01L 29/788–7889; G11C 16/00–349; G11C 16/04–0491
    See application file for complete search history.

(56) References Cited

U.S. PATENT DOCUMENTS

| | | | |
|---|---|---|---|
| 2016/0079185 A1* | 3/2016 | Kato | H01L 23/5226 257/314 |
| 2016/0315096 A1* | 10/2016 | Imamura | H01L 27/11565 |
| 2017/0103992 A1* | 4/2017 | Hachisuga | H01L 27/11575 |
| 2017/0213845 A1 | 7/2017 | Baba | |
| 2018/0269221 A1 | 9/2018 | Oda et al. | |
| 2019/0237477 A1* | 8/2019 | Baek | G11C 8/14 |
| 2019/0319042 A1* | 10/2019 | Baek | H01L 27/11573 |
| 2020/0135749 A1* | 4/2020 | Hwang | H01L 27/11575 |
| 2020/0161326 A1* | 5/2020 | Oh | H01L 23/528 |

FOREIGN PATENT DOCUMENTS

| | | |
|---|---|---|
| JP | 2017-168717 A | 9/2017 |
| JP | 2018-157096 A | 10/2018 |

* cited by examiner

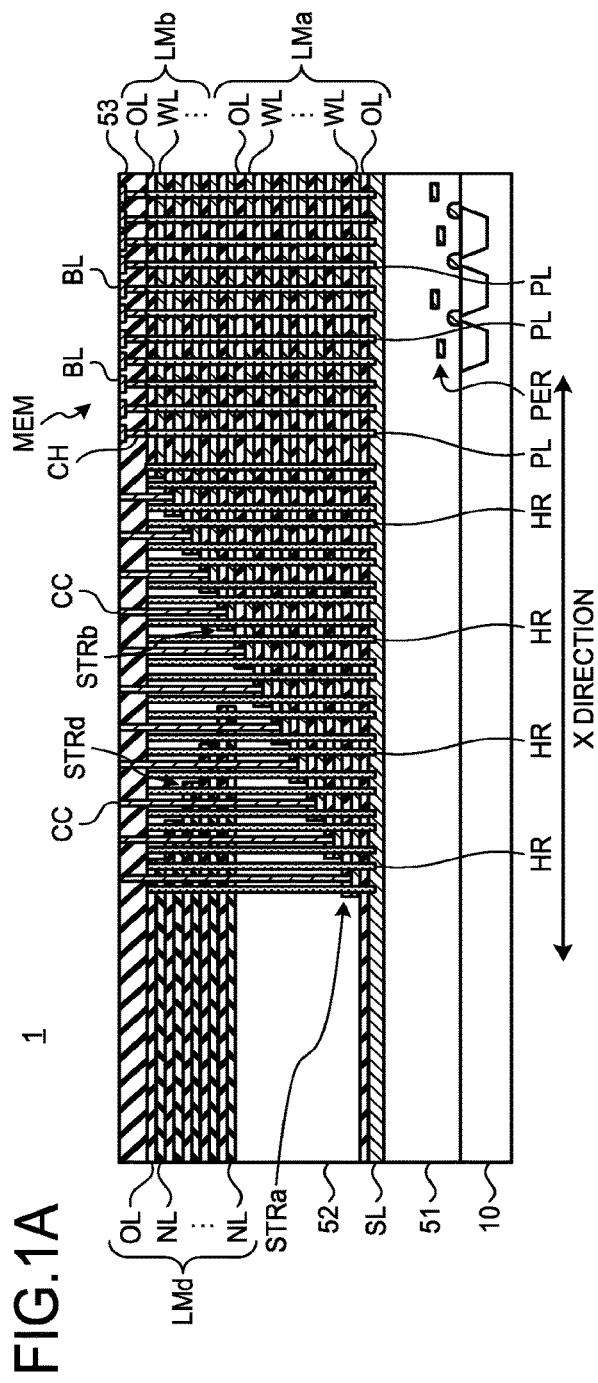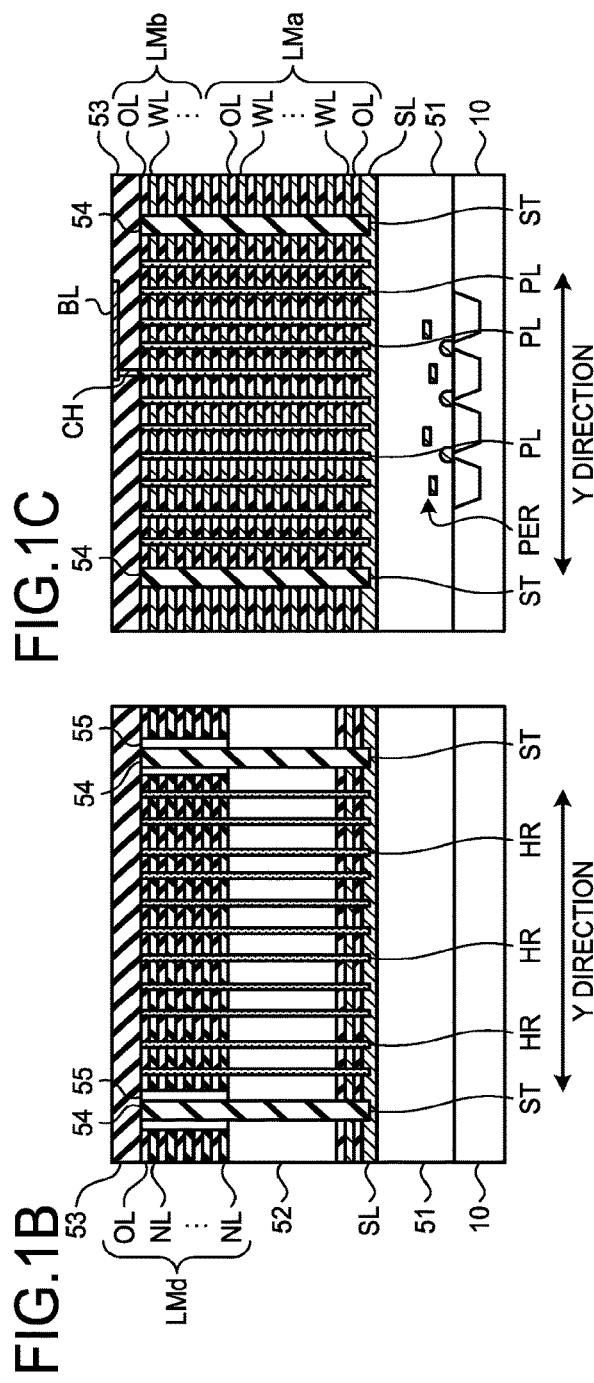

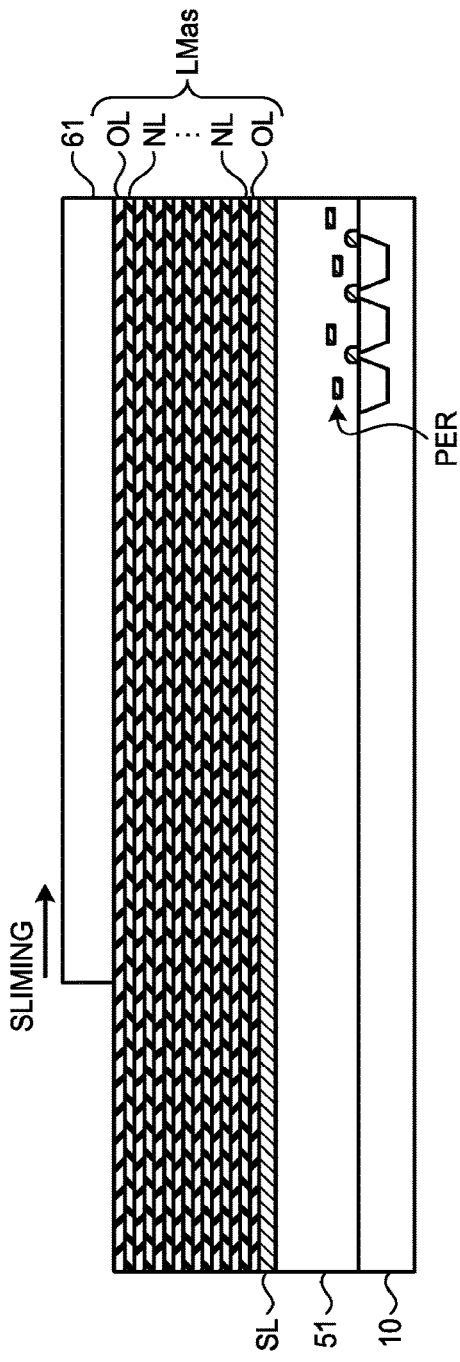
FIG.4A
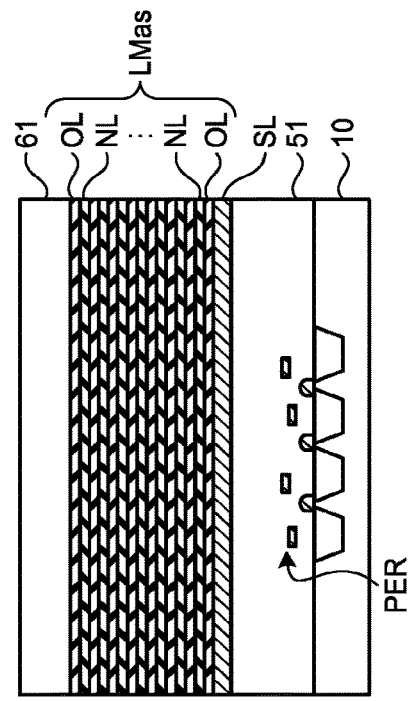
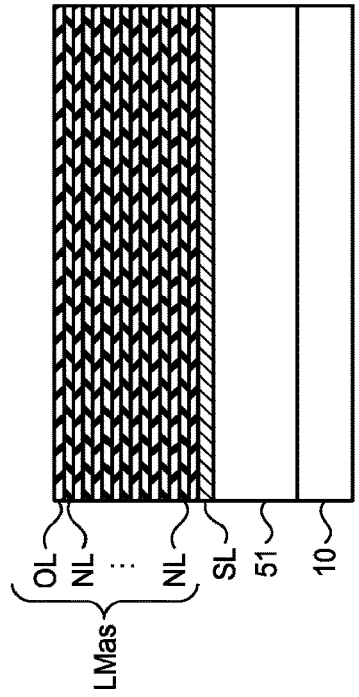
FIG.4B
FIG.4C

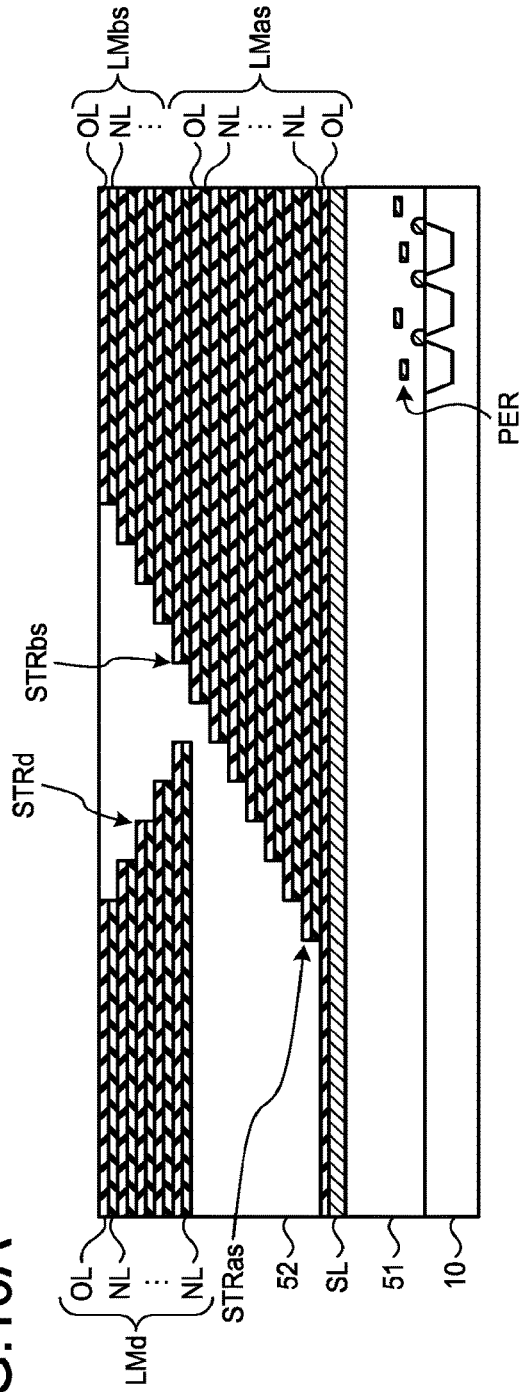
FIG.10A
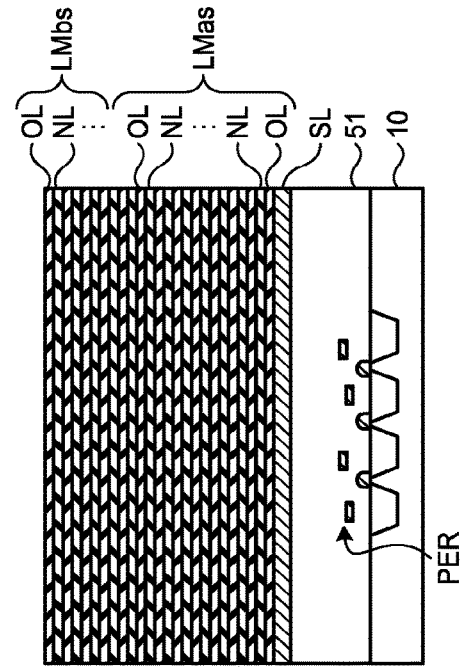
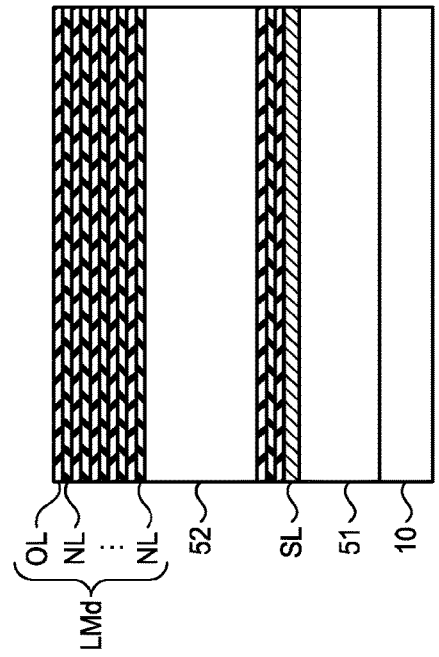
FIG.10B
FIG.10C

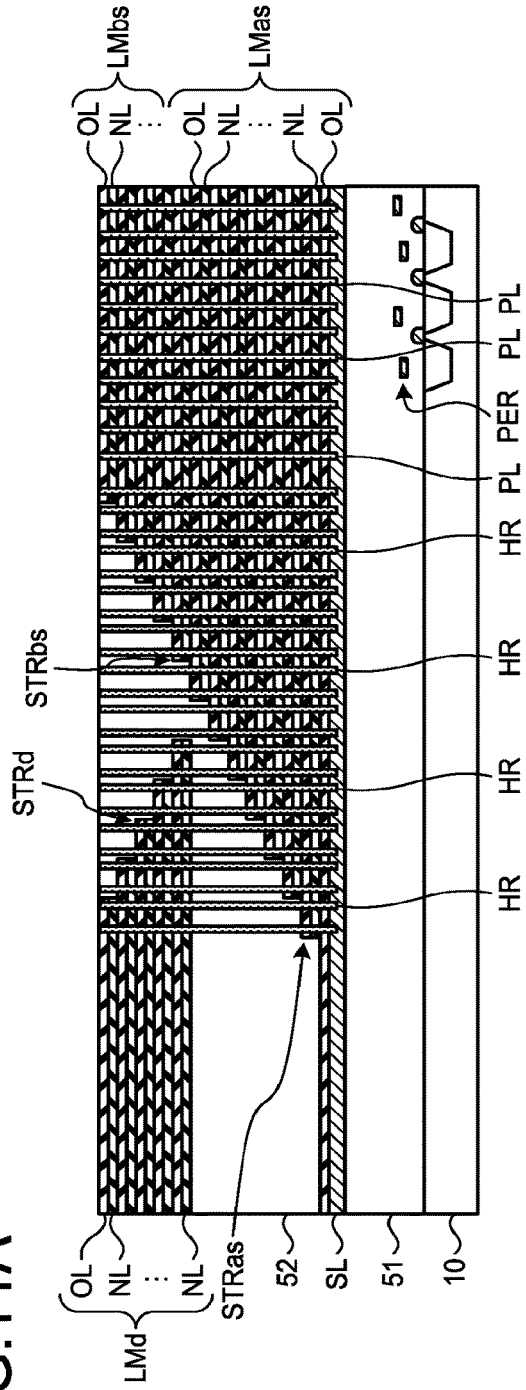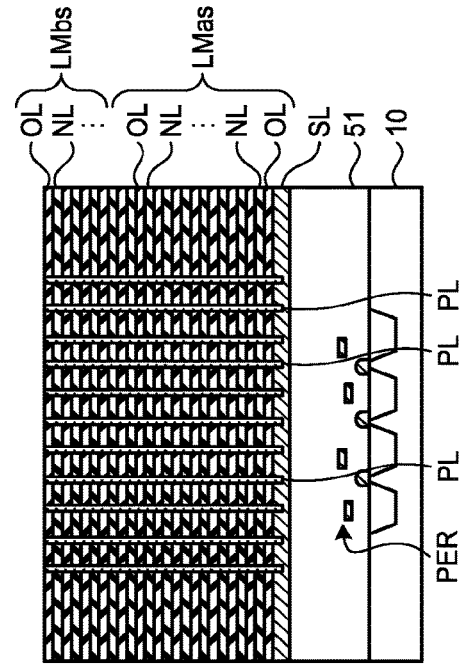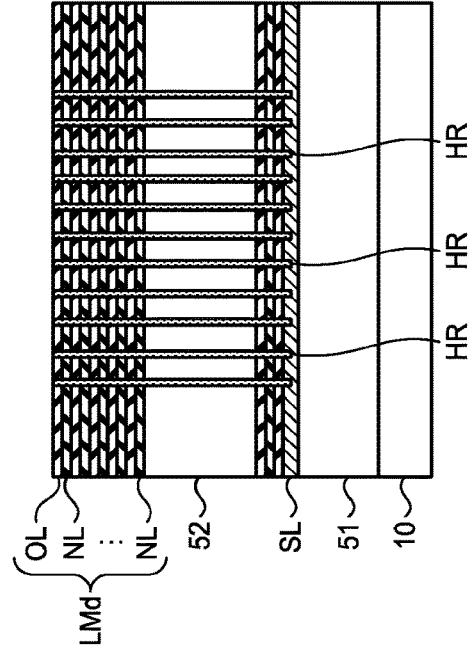
FIG.11A
FIG.11B
FIG.11C

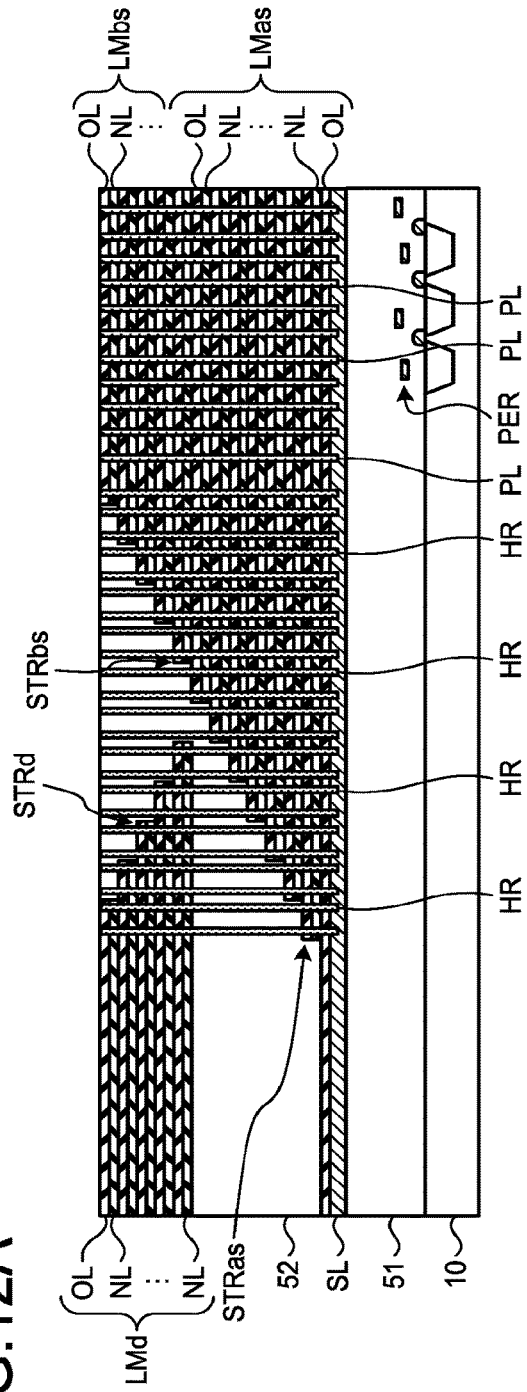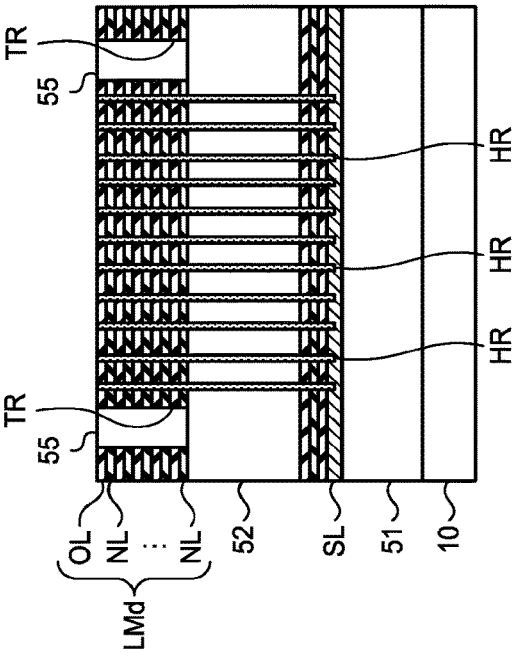

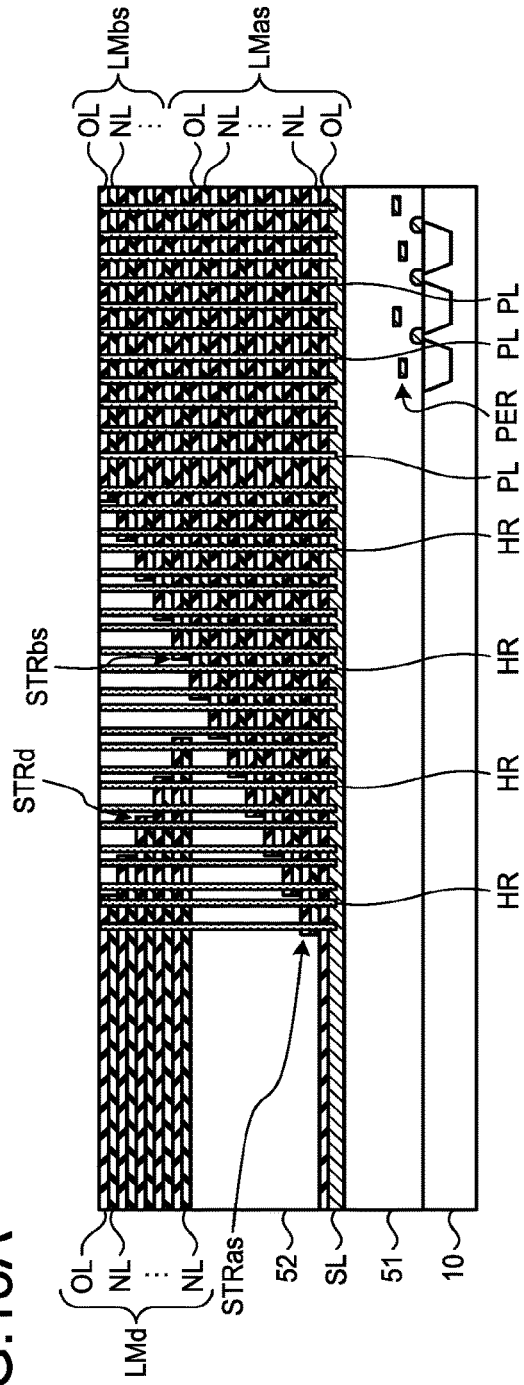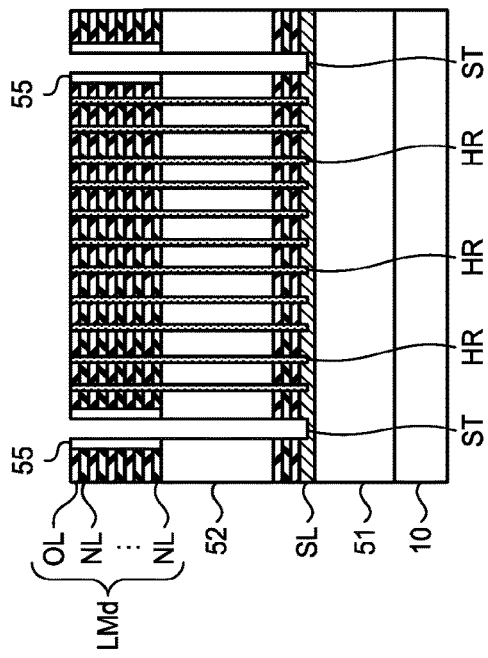
FIG.13A
FIG.13B
FIG.13C

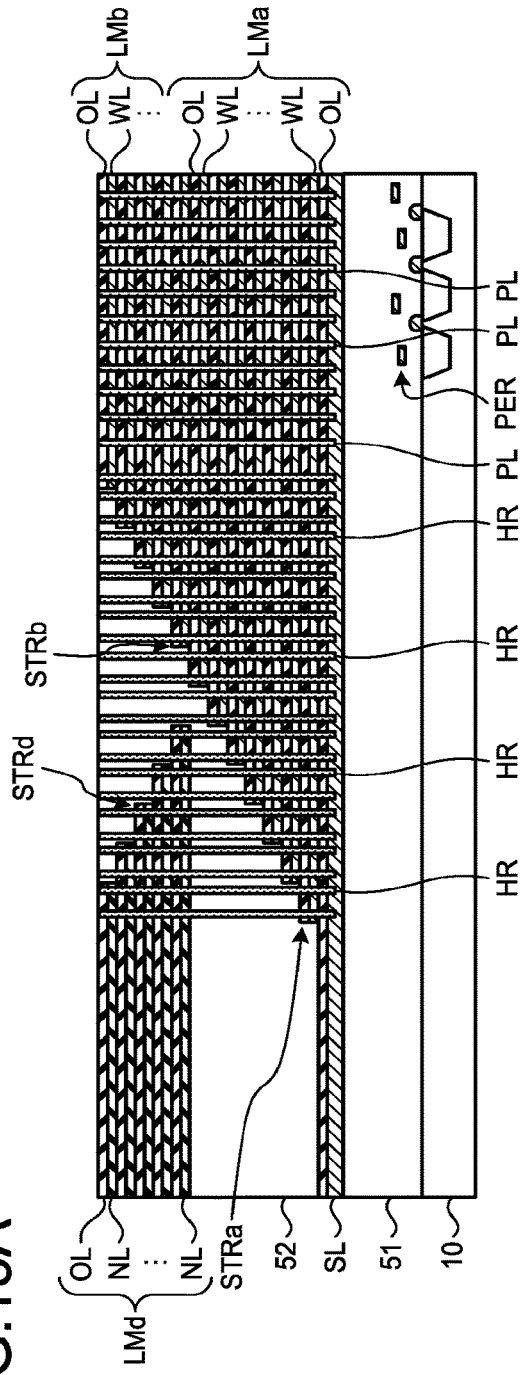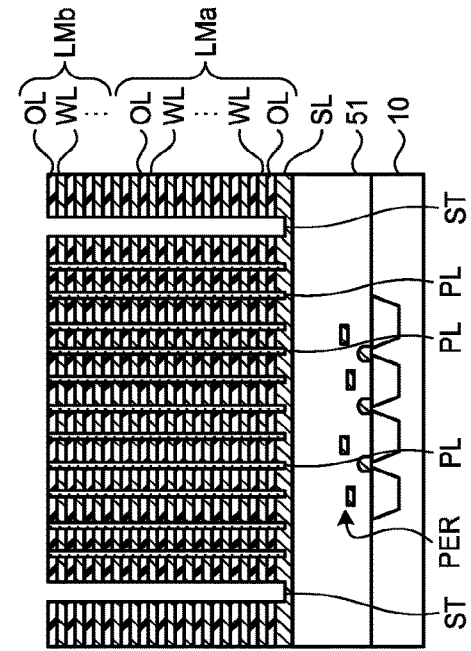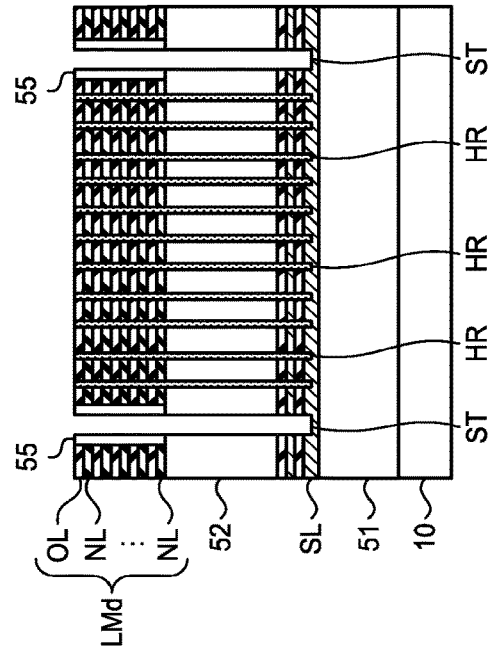

SEMICONDUCTOR STORAGE DEVICE AND METHOD FOR MANUFACTURING SEMICONDUCTOR STORAGE DEVICE

CROSS-REFERENCE TO RELATED APPLICATIONS

This application is based upon and claims the benefit of priority from Japanese Patent Application No. 2019-050385, filed on Mar. 18, 2019; the entire contents of which are incorporated herein by reference.

FIELD

Embodiments described herein relate generally to a semiconductor storage device and a method for manufacturing the semiconductor storage device.

BACKGROUND

In a three-dimensional nonvolatile memory, memory cells are three-dimensionally arranged with respect to a plurality of stacked conductive layers. In such a configuration, there is a case where, for example, a columnar structure penetrating each step is formed in a stepped portion of a stacked structure, which is a lead-out portion of a conductive layer, in order to maintain the strength of the stacked structure.

BRIEF DESCRIPTION OF THE DRAWINGS

FIGS. 1A to 1C are views illustrating examples of a configuration of a semiconductor storage device according to an embodiment;
FIGS. 4A to 4C are flow diagrams illustrating examples of the procedure of the process of manufacturing the semiconductor storage device according to the embodiment;
FIGS. 10A to 10C are flow diagrams illustrating examples of the procedure of the process of manufacturing the semiconductor storage device according to the embodiment;
FIGS. 11A to 11C are flow diagrams illustrating examples of the procedure of the process of manufacturing the semiconductor storage device according to the embodiment;
FIGS. 12A to 12C are flow diagrams illustrating examples of the procedure of the process of manufacturing the semiconductor storage device according to the embodiment;
FIGS. 13A to 13C are flow diagrams illustrating examples of the procedure of the process of manufacturing the semiconductor storage device according to the embodiment;
FIGS. 15A to 15C are flow diagrams illustrating examples of the procedure of the process of manufacturing the semiconductor storage device according to the embodiment.

DETAILED DESCRIPTION

Figure 2:
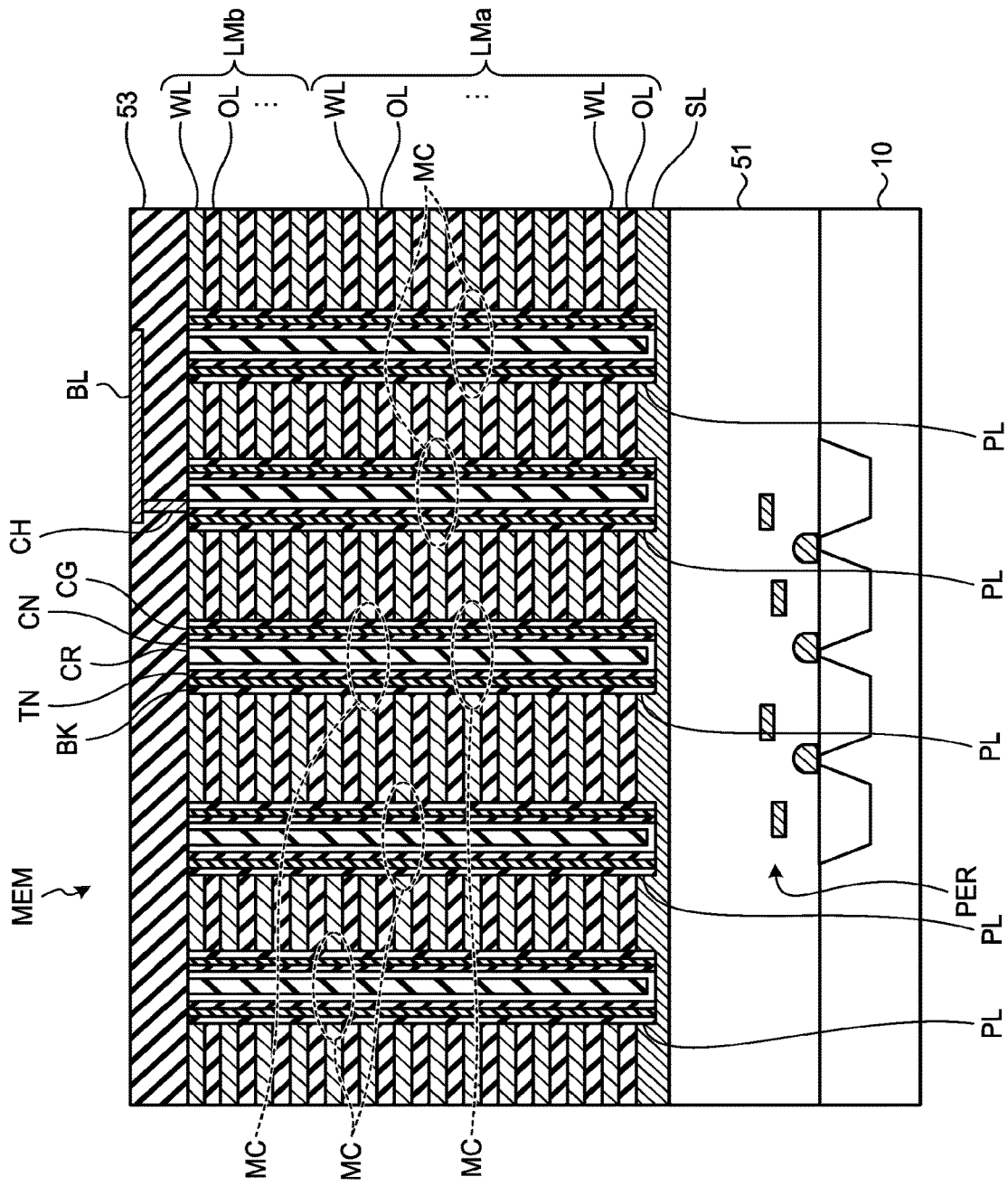
FIG. 2 is a view schematically illustrating a memory cell provided in the semiconductor storage device according to the embodiment.

A semiconductor storage device of an embodiment includes: a first stacked body in which a plurality of conductive layers are stacked via a first insulating layer, the first stacked body having a first stepped portion in which end portions of the plurality of conductive layers are formed in a step shape in an upper layer and a second stepped portion in which end portions of the plurality of conductive layers are formed in a step shape in a lower layer; a second stacked body in which a plurality of second insulating layers are stacked via a third insulating layer of an identical type as the first insulating layer, the second stacked body having a third stepped portion in which end portions of the plurality of second insulating layers in an identical level as the conductive layers forming the first stepped portion are formed in a step shape; a plurality of pillars which extend in a stacking direction of the first stacked body in the first stacked body and forms a plurality of memory cells at intersections with the plurality of conductive layers; a first columnar portion which is arranged in the first stepped portion and penetrates the first stacked body; and a second columnar portion which is arranged in the second stepped portion and penetrates the first stacked body. The first stepped portion and the third stepped portion oppose each other, and the second stepped portion and the third stepped portion overlap each other at least partially in a top view.

Hereinafter, the present invention will be described in detail with reference to the drawings. Incidentally, the present invention is not limited to the following embodiment. In addition, constituent elements in the following embodiment include those that can be easily assumed by those skilled in the art or those that are substantially the same.

(Configuration Example of Semiconductor Storage Device)

FIGS. 1A to 1C are views illustrating examples of a configuration of a semiconductor storage device 1 according to an embodiment. FIG. 1A is a cross-sectional view of the semiconductor storage device 1 of the embodiment taken along the X direction; FIG. 1B is a cross-sectional view of a stacked body LMd provided in the semiconductor storage device 1 of the embodiment taken along the Y direction; and FIG. 1C is a cross-sectional view of a memory portion MEM provided in the semiconductor storage device 1 of the embodiment taken along the Y direction.

Incidentally, the vertical direction in the present specification is defined based on shapes of stepped portions STRa, STRb, and STRd to be described later. Specifically, a direction in which terrace portions of the stepped portions STRa, STRb, and STRd, that is, exposed surfaces of insulating layers OL in each step of the stepped portions STRa, STRb, and STRd are directed is set as the upward direction.

As illustrated in FIGS. 1A to 1C, the semiconductor storage device 1 includes a peripheral circuit PER arranged on a substrate 10, and the stacked bodies LMa, LMb, and LMd arranged above the peripheral circuit PER.

The peripheral circuit PER includes a transistor such as a complementary metal oxide semiconductor (CMOS) transistor, and contributes to an operation of a memory cell, which will be described later, provided in the semiconductor storage device 1. The peripheral circuit PER is covered with an insulating layer 51.

A source line SL configured using, for example, a polysilicon layer or the like is arranged above the insulating layer 51.

The stacked bodies LMa and LMb as first stacked bodies are arranged on the source line SL. More specifically, the stacked body LMa in which a plurality of word lines WL as conductive layers and the insulating layers OL as first insulating layers are alternately stacked is arranged on the source line SL. The stacked body LMb in which a plurality of the word lines WL as conductive layers and the insulating layers OL as first insulating layers are alternately stacked is arranged on the stacked body LMa.

The word line WL is, for example, a tungsten layer or a molybdenum layer. The insulating layer OL is, for example, a SiO2 layer or the like. In the example of FIGS. 1A to 1C, the stacked body LMa has seven word lines WL and seven insulating layers OL. The stacked body LMb has five word lines WL and five insulating layers OL. However, the number of layers of the word lines WL and the insulating layers OL in each of the stacked bodies LMa and LMb is arbitrary.

In this manner, the semiconductor storage device 1 is a semiconductor storage device having a two-tier configuration in which, for example, stacked bodies LMa and LMb are stacked.

The stacked body LMa has a memory portion MEM and a stepped portion STRa in which an end portion of the stacked body LMa is stepped. The stacked body LMb includes the memory portion MEM and the stepped portion STRb in which an end portion of the stacked body LMb is formed in a step shape. The stepped portions STRa and STRb are covered with an insulating layer 52 up to a height of an upper surface of the stacked body LMb. An insulating layer 53 is arranged on the insulating layer 52.

In the memory portion MEM, a plurality of pillars PL which penetrate the stacked bodies LMa and LMb to reach the source line SL are arranged in a matrix. Memory cells are formed in the height direction of these pillars PL. A detailed configuration of the pillar PL will be described later. The pillar PL is connected to a bit line BL via a plug CH on the pillar PL.

The stepped portion STRa of the stacked body LMa has a step shape which is stepped up toward the memory portion MEM. The stepped portion STRa has one word line WL and one insulating layer OL, which is an upper layer of the word line WL, as one step, and has the number of steps as many as the number of the word lines WL and the insulating layers OL. That is, the stepped portion STRa has seven steps in total in the example of FIGS. 1A to 1C.

The stepped portion STRb of the stacked body LMb has a step shape which is stepped up toward the memory portion MEM. The stepped portion STRb has one word line WL and one insulating layer OL, which is the upper layer of the word line WL, as one step, and has the number of steps as many as the number of the word lines WL and the insulating layers OL. That is, the stepped portion STRb has five steps in total in the example of FIGS. 1A to 1C. The stepped portion STRb is arranged to be continuous with the stepped portion STRa, and each step of the stepped portion STRb corresponds to an upper step of the stepped portion STRa.

Columnar portions HR and contacts CC are arranged on the respective steps of the stepped portions STRa and STRb. The columnar portion HR penetrates the insulating layer 52, and penetrates the stacked body LMa or the stacked bodies LMa and LMb on a lower layer of each step to reach the source line SL. That is, the columnar portion HR arranged in any step of the stepped portion STRa penetrates the stacked body LMa on the lower layer of the step. The columnar portion HR arranged in any step of the stepped portion STRb penetrates both of the stacked bodies LMa and LMb on the lower layer of the step. The contact CC penetrates the insulating layers 53 and 52 and the insulating layer OL on an upper layer of each step to reach the word line WL on a lower layer of each step. An upper end of the contact CC is connected to, for example, an upper layer wiring. In this manner, the plurality of stacked word lines WL can be led out to the upper layer wiring by the stepped portions STRa and STRb.

The stacked body LMd as a second stacked body in which a plurality of insulating layers NL as second insulating layers and insulating layers OL as third insulating layers are alternately stacked is arranged inside the insulating layer 52 covering the stepped portions STRa and STRb of the stacked bodies LMa and LMb. The insulating layer NL is, for example, a SiN layer or the like. The insulating layer OL is made of the same material as the insulating layer OL of the stacked bodies LMa and LMb, and is, for example, a SiO2 layer or the like. The stacked body LMb has five insulating layers NL and five insulating layers OL in the example of FIGS. 1A to 1C. However, the number of layers of each of the insulating layers NL and OL in the stacked body LMd is arbitrary.

The stacked body LMd has the stepped portion STRd in which an end portion of the stacked body LMd is formed in a step shape. However, no memory cell is arranged inside the stacked body LMd as in the stacked bodies LMa and LMb, and the stacked body LMd is configured as, for example, a dummy that does not contribute to the operation of the semiconductor storage device 1.

The stepped portion STRd of the stacked body LMd has a step shape which is stepped down toward the memory portion MEM. The stepped portion STRd has one insulating layer NL and one insulating layer OL, which is the upper layer of the insulating layer NL, as one step, and has the number of steps as many as the number of the insulating layers NL and OL. That is, the stepped portion STRd has five steps in total in the example of FIGS. 1A to 1C.

The stacked body LMd is arranged at substantially the same height position as the stacked body LMb, and a level of each layer in the stacked body LMd, that is, a stacking height is equal to a level of each layer in the stacked body LMb. For example, the insulating layer NL in the lowermost layer of the stacked body LMd is in the same level as the word line WL in the lowermost layer of the stacked body LMb, and is arranged at substantially the same height. The insulating layer OL in the uppermost layer of the stacked body LMd is in the same level as the insulating layer OL in the uppermost layer of the stacked body LMb, and is arranged at substantially the same height. Therefore, the lowermost step of the stacked body LMd opposes the lowermost step of the stacked body LMb, and the uppermost step of the stacked body LMd opposes the uppermost step of the stacked body LMb. In other words, the entire stepped portion STRd of the stacked body LMd opposes the entire stepped portion STRb of the stacked body LMb.

The stepped portion STRd of the stacked body LMd is arranged at a position so as to be at least partially overlap the stepped portion STRa of the stacked body LMa in a top view. It is preferable that an overlapping area of the stepped portions STRd and STRa be large. In the example of FIGS. 1A to 1C, the lowermost step of the stepped portion STRd is at a position overlapping the fifth step from the lowermost step of the stepped portion STRa, and the uppermost step of the stepped portion STRd is at a position overlapping the lowermost step of the stepped portion STRa. FIG. 1B illustrates a cross section of a position where the uppermost step of the stepped portion STRd overlaps the lowermost step of the stepped portion STRa.

As a result, the columnar portions HR arranged in the respective steps of the stepped portion STRa of the stacked body LMa also penetrate the respective steps of the stepped portion STRd of the stacked body LMd. The columnar portion HR arranged at the fifth step from the lowermost step of the stepped portion STRa penetrates the first step of the stepped portion STRd. That is, the columnar portion HR penetrates the insulating layers NL and OL of one layer of the stepped portion STRd, and the word lines WL and the insulating layers OL of five layers of the stepped portion STRa. The columnar portion HR arranged at the lowermost step of the stepped portion STRa penetrates the uppermost step of the stepped portion STRd and the lower layer thereof. That is, the columnar portion HR penetrates the insulating layers NL and OL of five layers of the stepped portion STRd and the word line WL and the insulating layer OL of one layer of the stepped portion STRa.

In addition, the contacts CC arranged on the respective steps of the stepped portion STRa of the stacked body LMa also penetrate the respective steps of the stepped portion STRd of the stacked body LMd. The contact CC arranged at the fifth step from the lowermost step of the stepped portion STRa penetrates the first step of the stepped portion STRd. The contact CC arranged at the lowermost step of the stepped portion STRa penetrates the uppermost step of the stepped portion STRd and the lower layer thereof.

The stacked bodies LMa, LMb, and LMd are divided in the Y direction by a plurality of slits ST as strip portions extending in the X direction. The slit ST has, for example, a groove-like configuration, and the inside of the groove is filled with an insulating layer 54. Alternatively, the slit ST may function as a source line contact by filling the inside of the groove with a conductive layer having an insulating layer as a liner.

In a region where the stacked bodies LMa and LMb are arranged, the slit ST penetrates the stacked bodies LMa and LMb to reach the source line SL. In a region where the stacked body LMd is arranged, the slit ST penetrates the stacked body LMd and the insulating layer 52 below the stacked body LMd to reach the source line SL. Meanwhile, the stacked bodies LMa and LMb are in contact with a side surface of the slit ST, that is, the insulating layer 54, but the stacked body LMd has a gap against the slit ST, and is not in contact with the side surface of the slit ST, that is, the insulating layer 54. The gap between the stacked body LMd and the slit ST is filled with, for example, an insulating layer 55.

FIG. 2 is a view schematically illustrating a memory cell MC provided in the semiconductor storage device 1 according to the embodiment.

As illustrated in FIG. 2, the pillar PL includes, in order from the inner side of the pillar PL, a core layer CR, a channel layer CN, a tunnel insulating layer TN, a charge storage layer CG, and a block insulating layer BK. The channel layer CN is also arranged on a bottom surface of the pillar PL. The plug CH is connected to an upper end of the channel layer CN, and an upper end of the plug CH is connected to the bit line BL.

The core layer CR, the tunnel insulating layer TN, and the block insulating layer BK are, for example, SiO2 layers or the like. The channel layer CN is, for example, an amorphous silicon layer or a polysilicon layer. The charge storage layer CG is, for example, a SiN layer or the like.

Since the pillar PL has such a configuration, the memory cell MC is formed at an intersection between the pillar PL and the word line WL in each layer. A predetermined voltage is applied from the word line WL to the memory cell MC, and a predetermined charge is held in the memory cell MC, whereby the memory cell MC stores data in a nonvolatile manner. As a predetermined voltage from the word line WL to the memory cell MC, data stored in the memory cell MC is read.

However, one or more conductive layers including the lowermost layer of the stacked body LMa and the conductive layer of the uppermost layer of the stacked body LMb may function as a select gate line. In this case, a select gate is formed at an intersection of the select gate line and the pillar PL. As a predetermined voltage is applied from the select gate line to the select gate to turn on or off the select gate, the memory cell MC formed in a predetermined pillar PL can be selected as the memory cell MC to be operated.

In this manner, the semiconductor storage device 1 is configured as, for example, a three-dimensional nonvolatile memory in which the memory cells MC are three-dimensionally arranged in the memory portion MEM.

Incidentally, the columnar portion HR arranged at the above-described stepped portions STRa and STRb may have the same configuration as the pillar PL, for example. That is, the columnar portion HR may include, for example, a SiO2 layer, an amorphous silicon layer or a polysilicon layer, a SiO2 layer, a SiN layer, and a SiO2 layer in order from the inner side of the columnar portion HR. However, the columnar portion HR may have a different configuration from the pillar PL. In this case, the inside the columnar portion HR may be filled with, for example, a SiO2 layer or a SiN layer.

(Example of Process of Manufacturing Semiconductor Storage Device)

Next, an example of a process of manufacturing the semiconductor storage device 1 according to the embodiment will be described with reference to FIGS. 3A to 16C. FIGS. 3A to 16C are flow diagrams illustrating examples of a procedure of the process of manufacturing the semiconductor storage device 1 according to the embodiment; A in each of FIGS. 3A to 16C is a cross-sectional view taken along the X direction of the semiconductor storage device 1 in the manufacturing process, and corresponds to FIG. 1A. B in each of FIGS. 3A to 16C is a cross-sectional view taken along the Y direction of the stacked body LMd to be provided in the semiconductor storage device 1 in the manufacturing process, and corresponds to FIG. 1B. C in each of FIGS. 3A to 16C is a cross-sectional view taken along the Y direction of the memory portion MEM to be provided in the semiconductor storage device 1 in the manufacturing process, and corresponds to FIG. 1C.

Figure 3A:
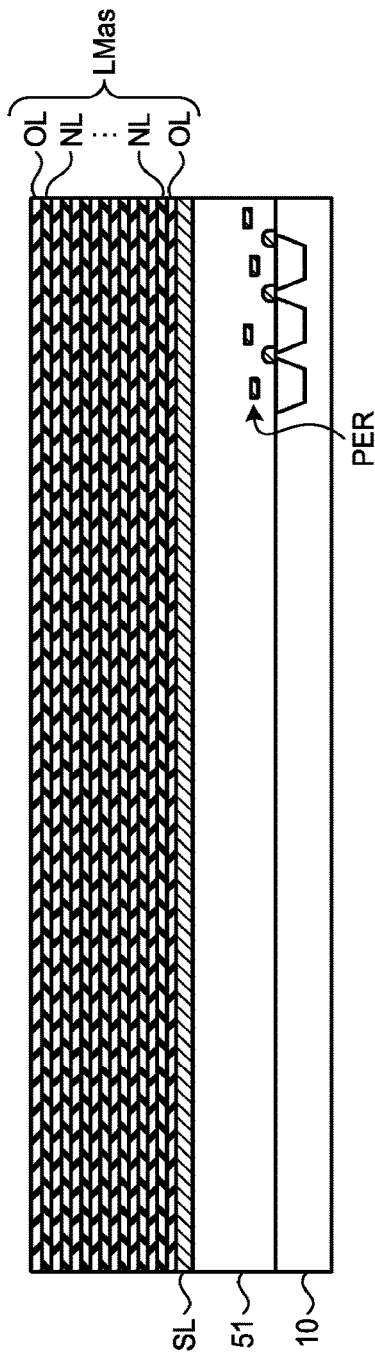
FIGS. 3A to 3C are flow diagrams illustrating examples of a procedure of a process of manufacturing the semiconductor storage device according to the embodiment.
Figure 3C:
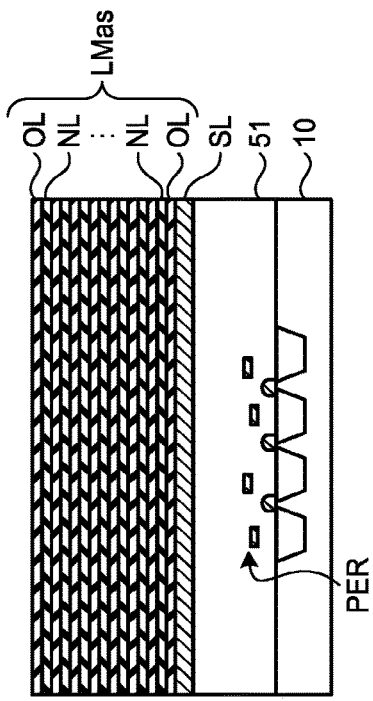
Figure 3B:
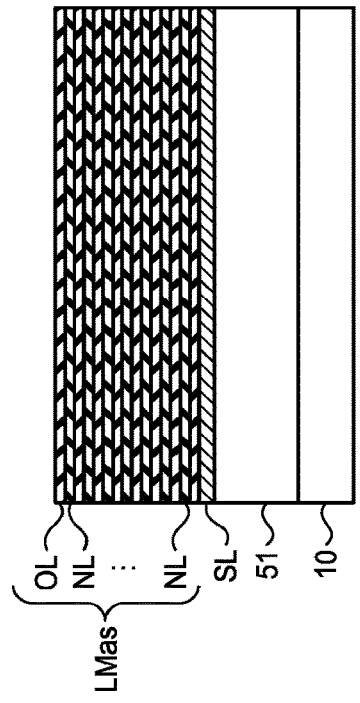

As illustrated in FIGS. 3A to 3C, the peripheral circuit PER including a transistor is formed on the substrate 10. The peripheral circuit PER can be formed, for example, using a general semiconductor circuit formation method. The peripheral circuit PER is covered with the insulating layer 51, and the source line SL configured using a polysilicon layer or the like is formed on the insulating layer 51.

A stacked body LMas in which the plurality of insulating layers NL and insulating layers OL are alternately stacked is formed on the source line SL. The insulating layer NL is, for example, a sacrificial layer which is replaced with a conductive material such as tungsten and molybdenum in a subsequent process to serve as a word line. The stacked body LMas is a portion to serve as the stacked body LMa of the first tier (Tier 1) after the process of replacing the insulating layer NL with the word line WL (hereinafter also referred to as replacement processing).

As illustrated in FIGS. 4A to 4C, a resist pattern 61 which covers a part of the stacked body LMas is formed in order to form a stepped portion STRas in the stacked body LMas. The resist pattern 61 covers a portion to serve as the memory portion MEM of the stacked body LMa and a portion to serve as the lowermost step of the stepped portion STRa.

The resist pattern 61 is slimmed by O2 plasma or the like, and the insulating layers NL and OL are partially removed into a step shape while being retracted to the side of the memory portion MEM later.

Figure 5A:
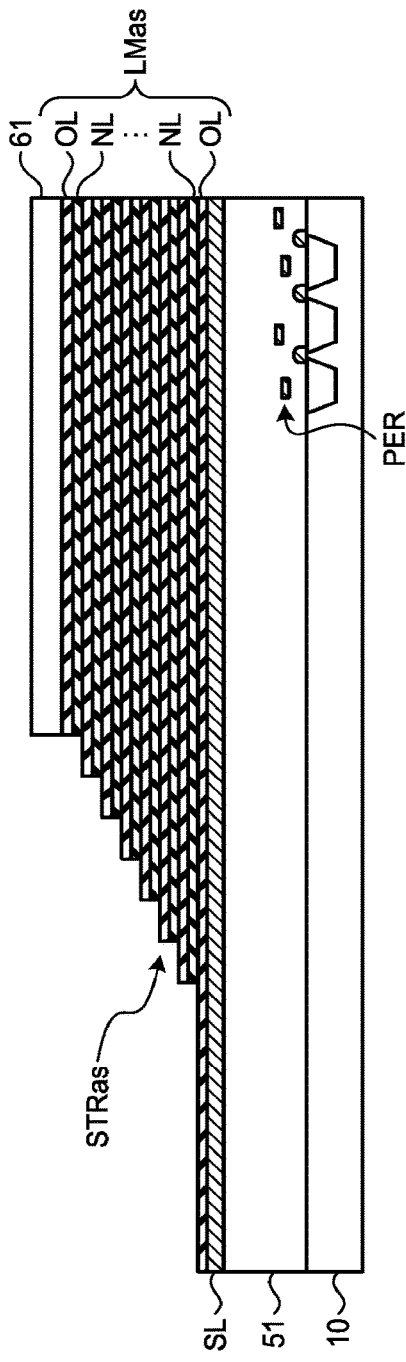
FIGS. 5A to 5C are flow diagrams illustrating examples of the procedure of the process of manufacturing the semiconductor storage device according to the embodiment.
Figure 5B:
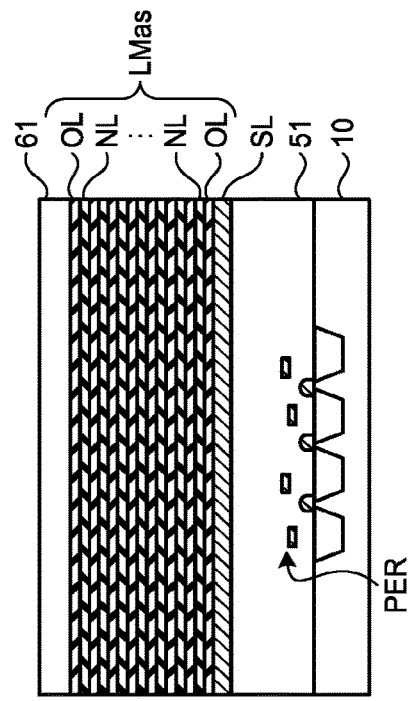
Figure 5C:
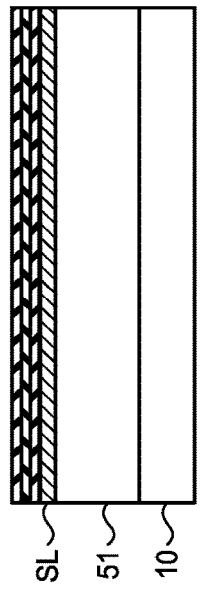

As illustrated in FIGS. 5A to 5C, the slimming of the resist pattern 61 and the removal of the insulating layers NL and OL are alternately repeated a plurality of times, whereby the stepped portion STRas is formed in the stacked body LMas. As illustrated in FIG. 5B, the stacked body LMas is completely removed from a region where the stacked body LMd is to be arranged later while leaving the insulating layers NL and OL of a predetermined step and lower steps. As illustrated in FIG. 5C, a state where the stacked body LMas completely remains is maintained in the region to serve as the memory portion MEM later.

Figure 6A:
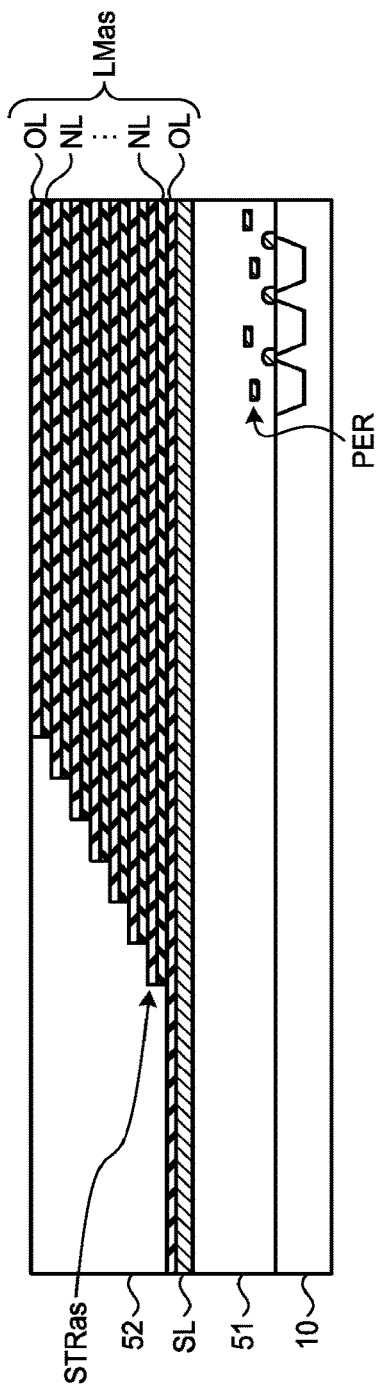
FIGS. 6A to 6C are flow diagrams illustrating examples of the procedure of the process of manufacturing the semiconductor storage device according to the embodiment.
Figure 6C:
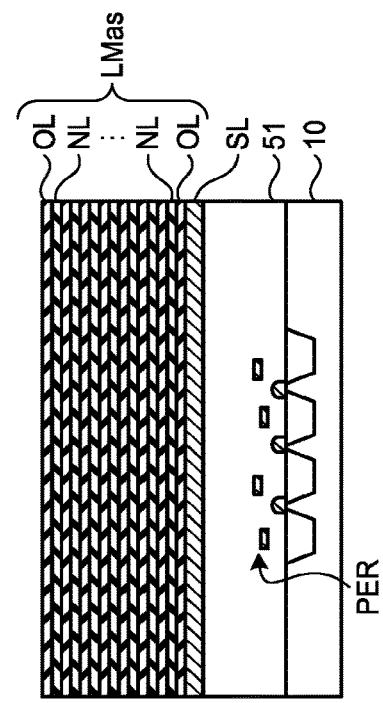
Figure 6B:
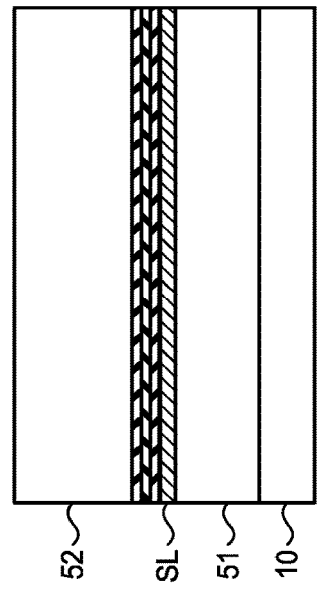

As illustrated in FIGS. 6A to 6C, the insulating layer 52 covering the stepped portion STRas is formed up to a height of an upper surface of the stacked body LMas.

Figure 7A:
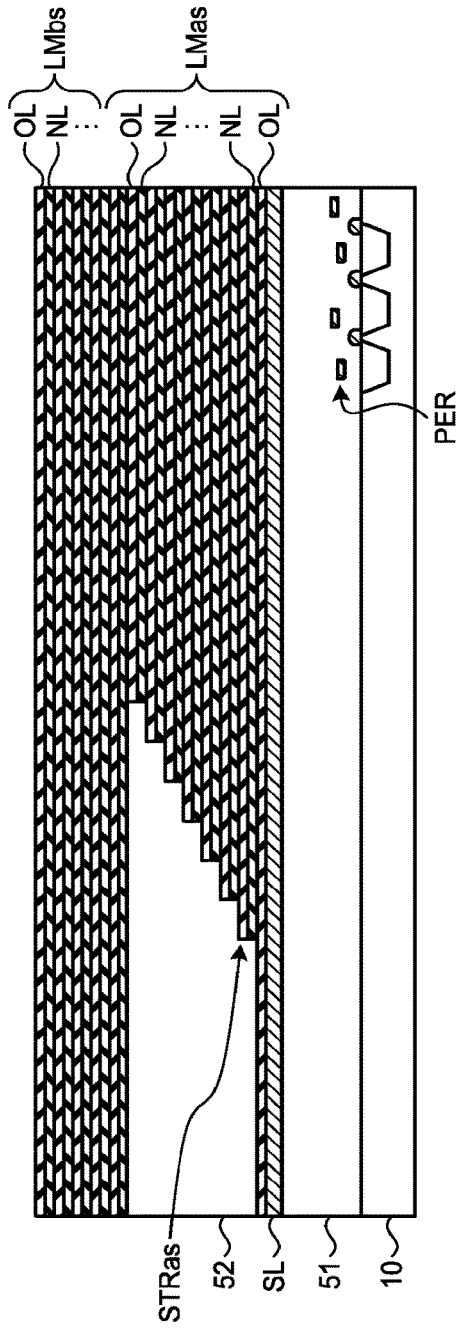
FIGS. 7A to 7C are flow diagrams illustrating examples of the procedure of the process of manufacturing the semiconductor storage device according to the embodiment.
Figure 7B:
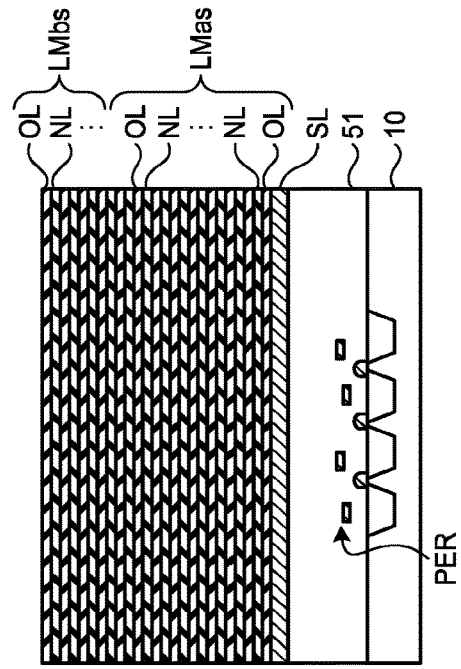
Figure 7C:
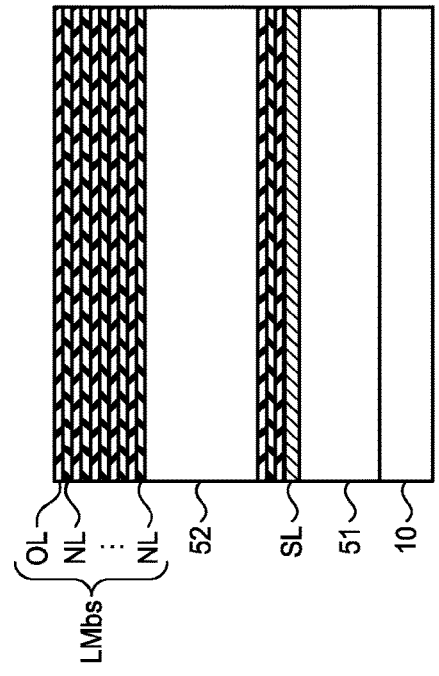

As illustrated in FIGS. 7A to 7C, a stacked body LMbs in which the insulating layer NL and the insulating layer OL are alternately stacked is formed on the insulating layer 52 in the region to serve as the memory portion MEM of the stacked body LMas, the stepped portion STRas, and a region where the stacked body LMd is to be arranged later. The stacked body LMbs is a portion to serve as the stacked body LMb of the second tier (Tier 2) after the replacement processing of the insulating layer NL with the word line WL. In addition, a stacked body LMd is also formed from a part of the stacked body LMbs.

Figure 8A:
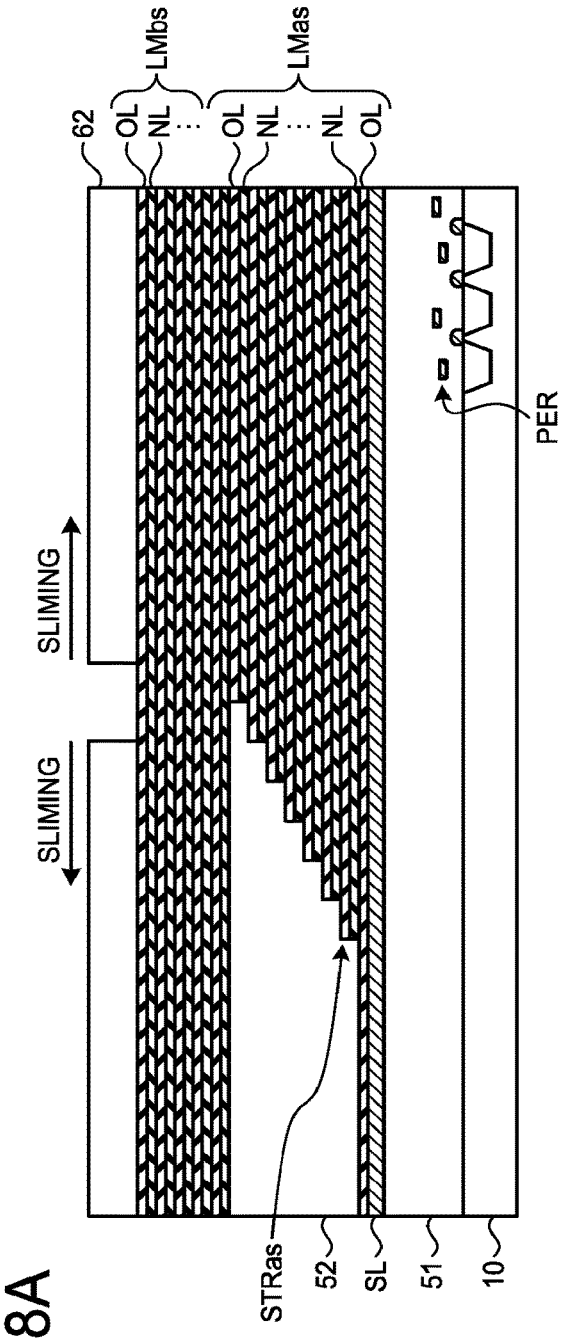
FIGS. 8A to 8C are flow diagrams illustrating examples of the procedure of the process of manufacturing the semiconductor storage device according to the embodiment.
Figure 8C:
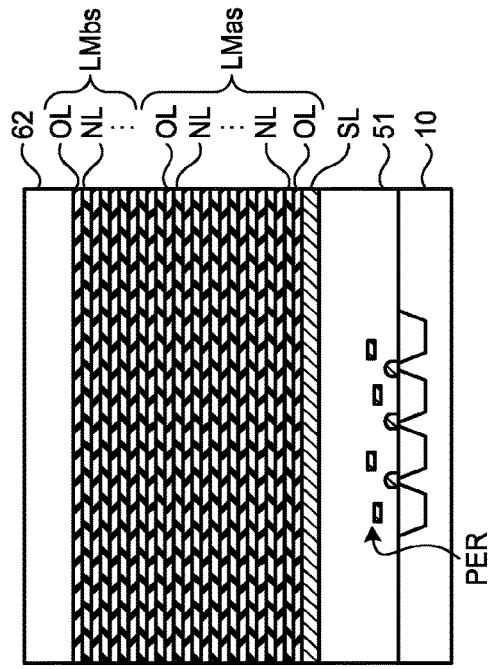
Figure 8B:
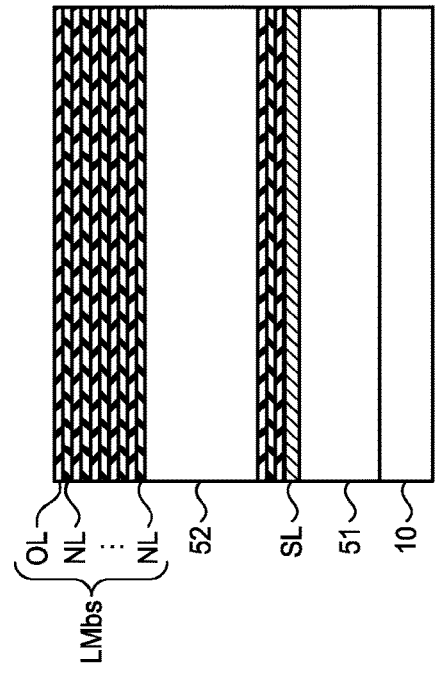

As illustrated in FIGS. 8A to 8C, a resist pattern 62 which covers a part of the stacked body LMbs is formed in order to form a stepped portion STRbs in the stacked body LMbs.

The resist pattern 62 covers a portion to serve as the memory portion MEM of the stacked body LMb and a portion to serve as the lowermost step of the stepped portion STRb. As a result, the stepped portions STRas and STRbs are continuously formed.

In addition, the resist pattern 62 covers a region where the stacked body LMd is to be arranged later. At this time, an end portion of the resist pattern 62 is made as close as possible to an end portion of the other resist pattern 62 so as to increase the overlapping area of the stepped portions STRas and STRd to be formed later. In the process of forming the resist pattern 62, it is preferable to perform patterning with a resolution corresponding thereto.

The resist pattern 62 covering a region to form the memory portion MEM and the stepped portion STRb is slimmed by O2 plasma or the like to recede to the side to form the memory portion MEM later. At this time, the resist pattern 62 covering the region in which the stacked body LMd is to be arranged recedes to the opposite side to the memory portion MEM. In this manner, the insulating layers NL and OL are partially removed into a step shape while retracting the resist pattern 62 in the respective directions.

Figure 9A:
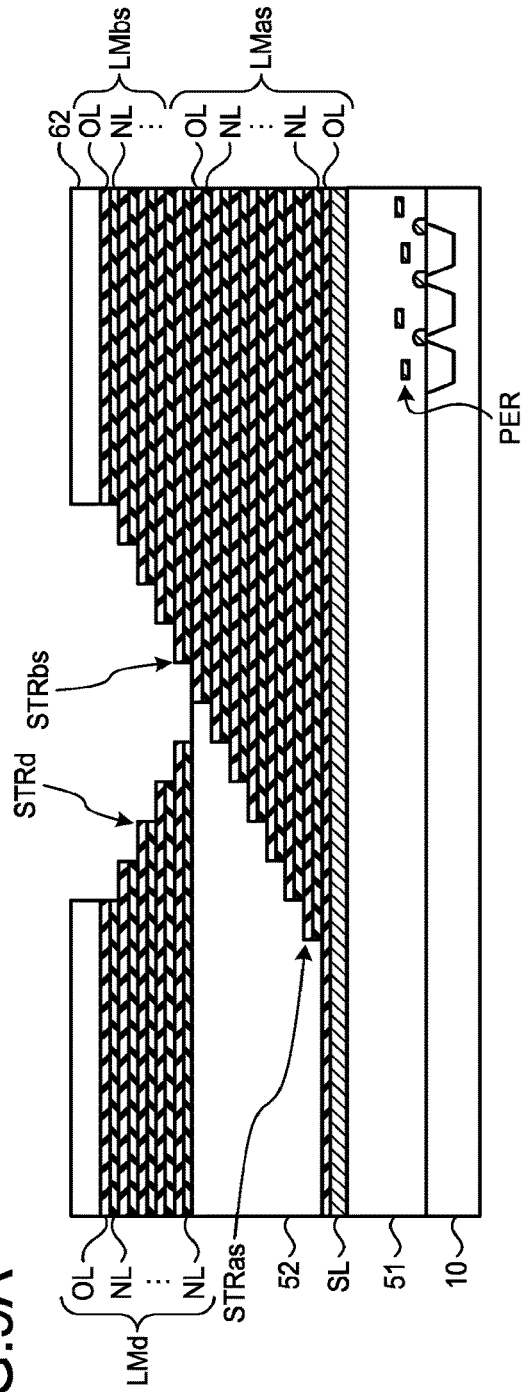
FIGS. 9A to 9C are flow diagrams illustrating examples of the procedure of the process of manufacturing the semiconductor storage device according to the embodiment.
Figure 9B:
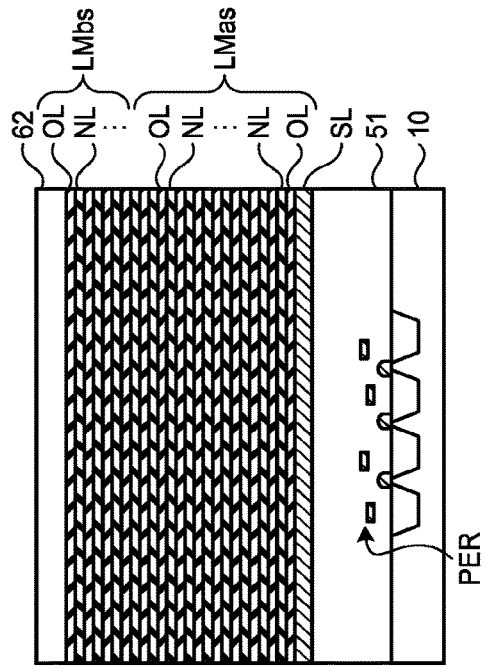
Figure 9C:
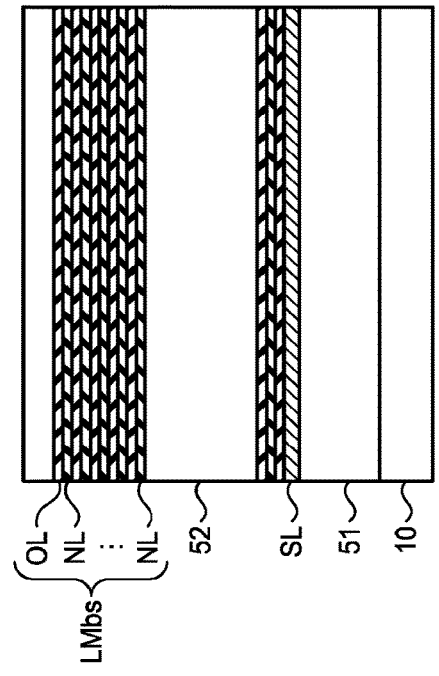

As illustrated in FIGS. 9A to 9C, a stepped portion STRbs continuous with the stepped portion STRas is formed at a hem portion of the resist pattern 62 by the recession of the resist pattern 62 covering the region to form the stepped portion STRb. The stepped portion STRd is formed at the hem portion of the resist pattern 62 by the recession of the resist pattern 62 covering the region where the stacked body LMd is to be arranged. In addition, as the stepped portions STRbs and STRd are formed, the stacked body LMd in which the insulating layers NL and OL are stacked is separated from the stacked body LMbs.

As a result, the stacked body LMd having the stepped portion STRd opposing the stepped portion STRbs is formed.

As illustrated in FIGS. 10A to 10C, the insulating layer 52 is further formed to cover the stepped portions STRbs and STRd up to heights of upper surfaces of the stacked body LMbs and LMd.

As illustrated in FIGS. 11A to 11C, the pillars PL penetrating the stacked bodies LMas and LMbs and the columnar portions HR arranged in the respective steps of the stepped portions STRas and STRbs are formed.

More specifically, a memory hole which penetrates the stacked bodies LMas and LMbs to reach the source line SL is formed in the region to form the memory portion MEM. In addition, the block insulating layer BK, the charge storage layer CG, the tunnel insulating layer TN, and the channel layer CN are formed from an inner wall side of the memory hole. The channel layer CN is also formed on a bottom surface of the memory hole. The inner side of the channel layer CN is filled with the core layer CR. As a result, the pillar PL is formed.

For example, in parallel, a hole, which penetrates the upper insulating layer 52 and from the respective steps to the stacked bodies LMas and LMbs on the lower layer to reach the source line SL, is formed in the stepped portion STRbs. In the stepped portion STRas, the hole, which penetrates the upper insulating layer 52, from a predetermined step of the stacked body LMd to a lower layer portion, and from the respective steps to the stacked body LMas on the lower layer and reaches the source line SL, is formed. The same material as that in the pillar PL is formed in the hole formed in this manner, for example, in parallel with the film formation in the pillar PL.

However, the pillar PL and the columnar portion HR are not necessarily formed in parallel. For example, the film formation in the memory hole and the film formation in the hole may be performed separately after forming the memory hole of the pillar PL and the hole of the columnar portion HR in parallel. In this case, a member constituting the pillar PL may be different from a member constituting the columnar portion HR. In addition, for example, the memory hole of the pillar PL and the hole of the columnar portion HR may be formed separately, and the film formation in the memory hole and the film formation in the hole may be performed separately.

Here, the columnar portions HR arranged from the uppermost step of the stacked body LMbs to the lowermost step of the stacked body LMas are collectively formed even when the columnar portion HR is formed by any of the above procedures.

At this time, in the stepped portion STRbs, the number of stacked layers through which the hole penetrates is the largest at the uppermost step of the stepped portion STRbs by penetrating through twelve insulating layers NL and twelve insulating layers OL, and is the smallest at the lowest step of the stepped portion STRbs by penetrating through eight insulating layers NL and eight insulating layers OL.

In addition, in the stepped portion STRas, the number of stacked layers through which the hole penetrates is the largest at the uppermost step of the stepped portion STRas by penetrating through seven insulating layers NL and seven insulating layers OL. In addition, the number of stacked layers through which the hole penetrates is constant from a step below the uppermost step to the lowermost step of the stepped portion STRas. The hole penetrates through six insulating layers NL and six insulating layers OL of the stacked body LMas at one step below the uppermost step of the stepped portion STRas, that is, the sixth step from the lowermost step. At the fifth step from the lowermost step of the stepped portion STRas, the hole penetrates through six insulating layers NL and six insulating layers OL in total including one insulating layer NL and one insulating layer OL in the first step of the stacked body LMd and five insulating layers NL and five insulating layers OL in the fifth and lower steps of the stacked body LMas. At the lowermost step of the stepped portion STRas, the hole penetrates through six insulating layers NL and six insulating layers OL in total including five insulating layer NL and five insulating layer OL in the fifth and lower steps of the stacked body LMd and one insulating layer NL and one insulating layer OL in the first step of the stacked body LMas.

Incidentally, a difference in the number of stacked layers through which the arranged in the respective steps of the stepped portion STRas penetrate decreases as the overlapping area of the stepped portions STRas and STRd increases, that is, as the stepped portions STRas and STRd overlap each other in more steps.

As illustrated in FIGS. 12A to 12C, a plurality of trenches TR penetrating the stacked body LMd are formed. The trench TR is formed at the forming position of the slit ST so as to have a width in the Y direction wider than that of the slit ST. The inside of the trench TR is embedded with the insulating layer 55.

As illustrated in FIGS. 13A to 13C, the plurality of slits ST are formed to penetrate the stacked bodies LMas, LMbs, and LMd to reach the source line SL. At this time, the slit ST is formed so as to separate the respective insulating layers NL and OL in the stacked bodies LMas and LMbs. The slit ST is formed to be arranged inside the trench TR in the stacked body LMd. At this time, the inside of the slit ST is filled with nothing.

Figure 14A:
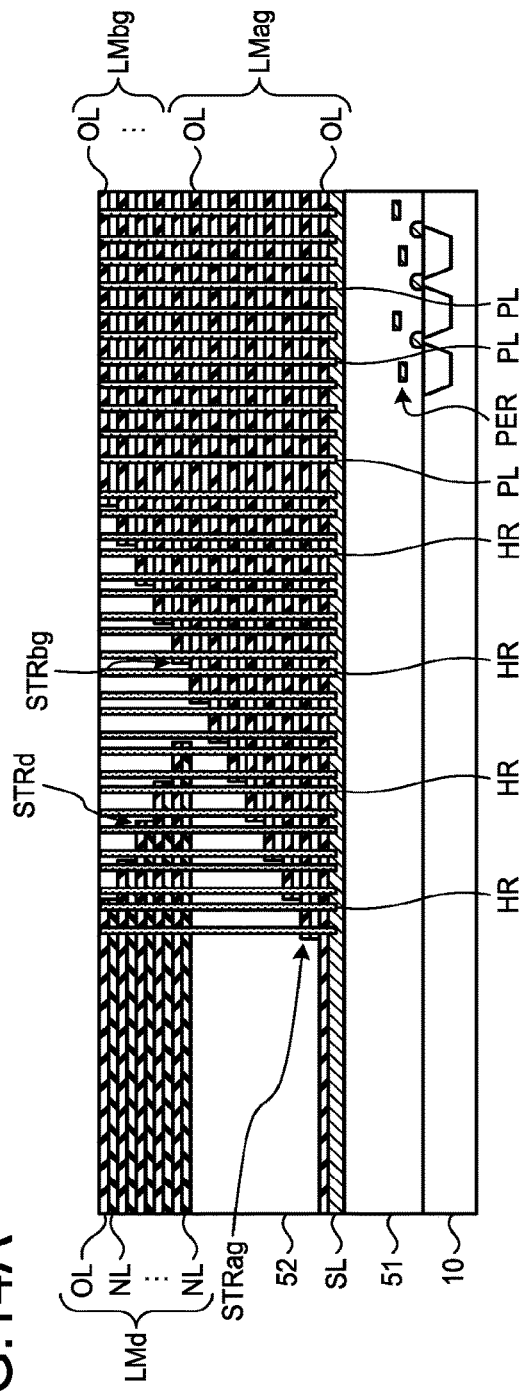
FIGS. 14A to 14C are flow diagrams illustrating examples of the procedure of the process of manufacturing the semiconductor storage device according to the embodiment.
Figure 14C:
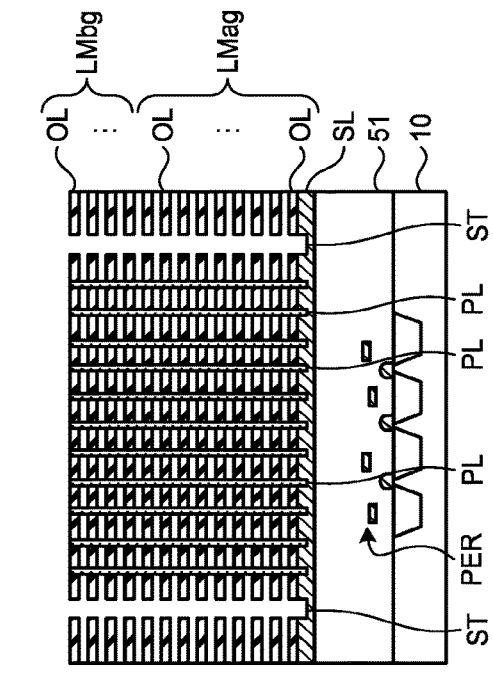
Figure 14B:
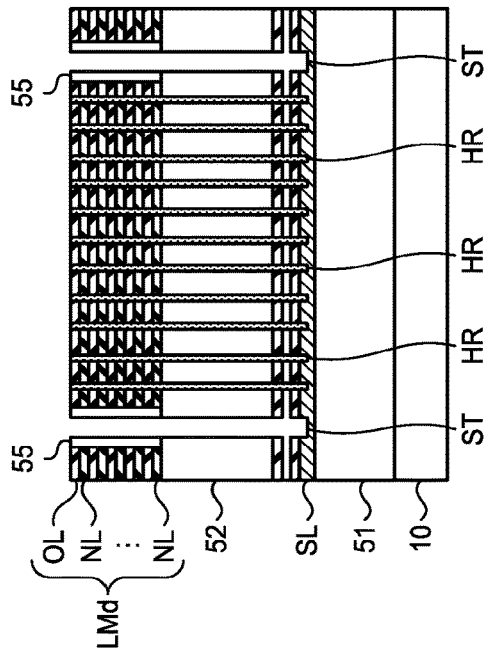

As illustrated in FIGS. 14A to 14C, the insulating layers NL of the stacked bodies LMas and LMbs are removed via the slits ST. As a result, stacked bodies LMag and LMbg having gaps between the insulating layers OL are formed, the gaps formed by removal of the insulating layers NL. The stacked bodies LMag and LMbg have a fragile structure having the gap between the insulating layers OL. However, the fragile structure is supported by the plurality of pillars PL having a stacked structure in the region to form the memory portion MEM later. In addition, the stepped portions STRag and STRbg also have a fragile structure having a gap between the insulating layers OL, but the fragile structure is supported by the columnar portions HR arranged to penetrate the respective steps.

On the other hand, each layer of the stacked body LMd is not in direct contact with the slit ST, and the insulating layer NL of the stacked body LMd is not removed.

As illustrated in FIGS. 15A to 15C, the gaps of the stacked body LMag and LMbg are filled with a conductive material such as tungsten and molybdenum via the slits ST to form the word lines WL. As a result, the stacked bodies LMa and LMb in which the plurality of word lines WL and the insulating layers OL are alternately stacked are formed.

Meanwhile, each layer of the stacked body LMd is not in direct contact with the slit ST, and the insulating layer NL of the stacked body LMd is not replaced with the word line WL.

Figure 16A:
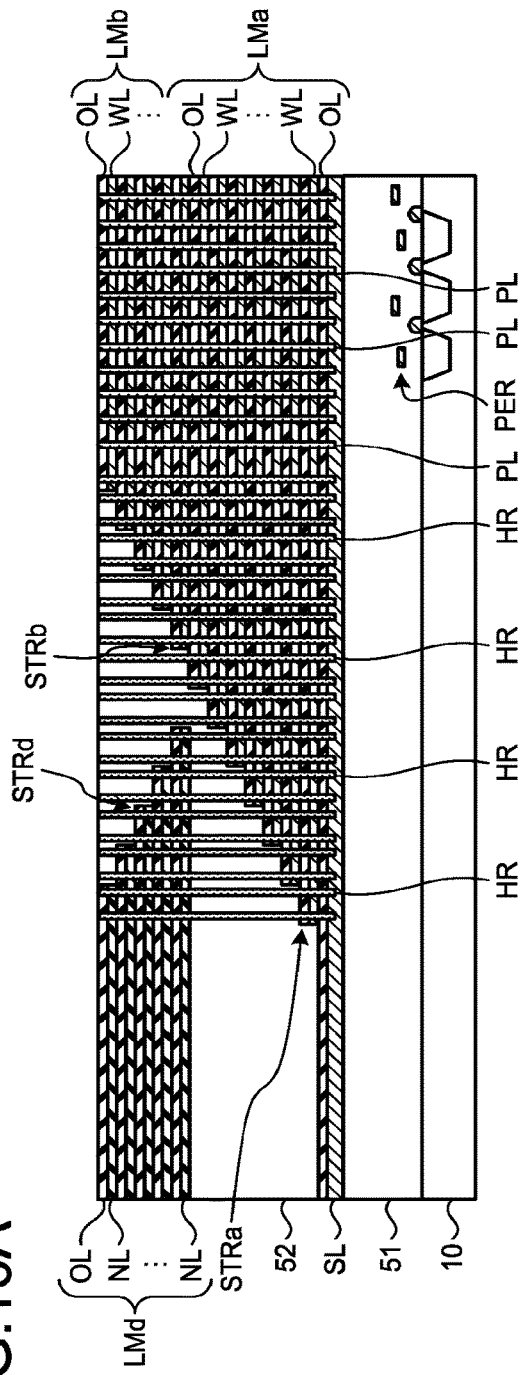
FIGS. 16A to 16C are flow diagrams illustrating examples of the procedure of the process of manufacturing the semiconductor storage device according to the embodiment.
Figure 16C:
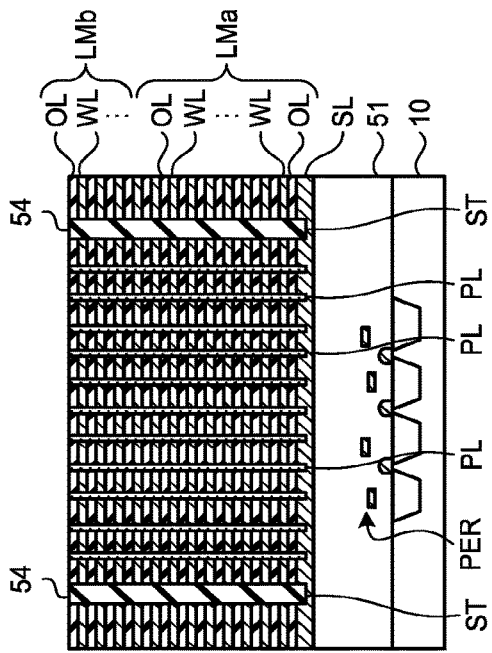
Figure 16B:
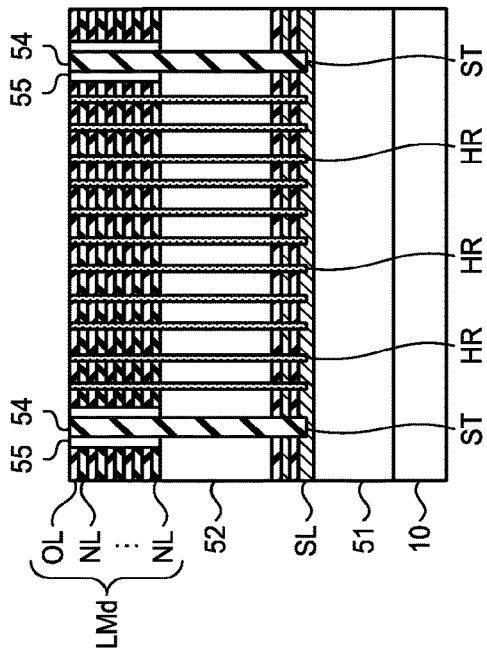

As illustrated in FIGS. 16A to 16C, for example, the inside of the slit ST is filled with the insulating layer 55. At this time, the inside of the slit ST may be filled with a conductive layer using an insulating layer as a liner, and the slit ST may function as a source line contact or the like.

Thereafter, the plug CH is formed on the channel layer CN of the pillar PL, and the contact CC is formed at each step of the stepped portion STR. The contact CC arranged at each step of the stepped portion STRb is formed by forming a contact hole that mainly penetrates the insulating layer 52 above the stepped portion STRb and embedding a conductive material inside the contact hole. The contact CC arranged at each step of the stepped portion STRa is formed by forming a contact hole that also penetrates the stacked body LMd above the stepped portion STRa and embedding a conductive material inside the contact hole.

Thereafter, the bit line BL connected to the plug CH, the upper layer wiring connected to the contact CC, and the like are formed.

Then, the process of manufacturing the semiconductor storage device 1 of the embodiment is ended.

(Comparative Example)

In a semiconductor storage device of a comparative example, a dummy stacked body overlapping a stepped portion in the lower tier (Tier 1) is not arranged. As a result, there is a case where a plurality of are processed to have different shapes at the time of forming the prior to formation of a columnar portion. This is because the hole needs to penetrate more layers in a stacked body, for example, in a stepped portion in the upper tier (Tier 2) as compared to the stepped portion in the lower tier (Tier 1).

If a condition for a hole formation process is constructed in accordance with the stepped portion in Tier 2, the hole in the stepped portion in Tier 1 may be in a bowing shape or pierce through a source line. If the hole has the bowing shape, embedding of a predetermined material fails in some cases. If the hole pierces through the source line, a lower layer structure is affected in some cases.

According to the semiconductor storage device 1 of the embodiment, the stacked body LMd above the stepped portion STRas is also penetrated by the hole at the time of forming the hole to form the columnar portion HR in the stepped portion STRas in Tier 1. As a result, it is possible to reduce the difference in the number of insulating layers NL and OL to be penetrated between the hole in the stepped portion STRbs in Tier 2 and the hole in the stepped portion STRas in Tier 1. Thus, it is possible to suppress the difference in the hole shape between the stepped portion STRbs in Tier 2 and the stepped portion STRas in Tier 1.

According to the semiconductor storage device 1 of the embodiment, the overlapping area of the stepped portion STRa in Tier 1 and the stepped portion STRd of the stacked body LMd is configured to be large. As a result, the difference in the number of stacked layers through which the arranged in the respective steps penetrate is reduced in the stepped portion STRas, and it is possible to further reduce the difference in the hole shape.

According to the semiconductor storage device 1 of the embodiment, the process of forming the stacked body LMd is performed substantially in parallel with the process of forming the stepped portion STRb in Tier 2. As a result, the stacked body LMd can be formed without increasing the number of manufacturing processes of the semiconductor storage device 1, and it is possible to prevent the process of manufacturing the semiconductor storage device 1 from being complicated and to suppress a cost increase.

According to the semiconductor storage device 1 of the embodiment, the insulating layer NL in the stacked body LMd is not replaced with the conductive layer such as the word line WL by the replacement processing. Although it is extremely difficult to remove the stacked layers of the word line WL and the insulating layer OL after replacement by etching, it is sufficient to penetrate the insulating layers NL and OL in the stacked body LMd by removal using etching when forming the contact hole for the contact CC, and it is easy to form the contact hole. It is also possible to form a contact hole so as to be in contact with the word line WL of each step of the stepped portion STRa and not to penetrate the word line WL. In addition, the contact CC can be arranged in each step of the stepped portion STRa by penetrating the stacked body LMd without concerning the electrical influence.

According to the semiconductor storage device 1 of the embodiment, the area occupied by the insulating layers NL and OL increases by arranging the stacked body LMd, a difference in thermal contraction caused by a difference in constituent materials is reduced in the heat treatment during the manufacturing process, and it is possible to suppress warpage or the like of the substrate 10.

Incidentally, the pillars PL are formed collectively for the stacked bodies LMas and LMbs in the above-described embodiment, but the present invention is not limited thereto. The pillars PL may be formed to separate upper and lower structures by forming a part of the lower structure of the pillar PL in a state where only the stacked body LMas is formed and forming the whole of the pillar PL after the formation of the stacked body LMbs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a first stacked body in which a plurality of conductive layers are stacked via a first insulating layer, the first stacked body having a first stepped portion in which end portions of the plurality of conductive layers are formed in a step shape in an upper layer and a second stepped portion in which end portions of the plurality of conductive layers are formed in a step shape in a lower layer;
a second stacked body in which a plurality of second insulating layers are stacked via a third insulating layer of an identical type as the first insulating layer, the second stacked body having a third stepped portion in which end portions of the plurality of second insulating layers in identical levels as the conductive layers forming the first stepped portion are formed in a step shape;
a plurality of pillars which extend in a stacking direction of the first stacked body in the first stacked body and forms a plurality of memory cells at intersections with the plurality of conductive layers;
a first columnar portion which is arranged in the first stepped portion and penetrates the first stacked body; and
a second columnar portion which is arranged in the second stepped portion and penetrates the first stacked body,
wherein the first stepped portion and the third stepped portion oppose each other, and the second stepped portion and the third stepped portion overlap each other at least partially in a top view.

2. The semiconductor storage device according to claim 1, wherein
an upper step of the second stepped portion and a lower step of the third stepped portion overlap each other in the top view, and
a lower step of the second stepped portion and an upper step of the third stepped portion overlap each other in the top view.

3. The semiconductor storage device according to claim 1, wherein
a total number of layers of the conductive layers to a lowermost layer of the first stacked body of the second stepped portion and the second insulating layers to a lowermost layer of the second stacked body in the third stepped portion is equal to a total number of layers of the conductive layers from the second stepped portion to the lowermost layer of the first stacked body and the second insulating layers from the third stepped portion to the lowermost layer of the second stacked body.

4. The semiconductor storage device according to claim 1, wherein
the first columnar portion penetrates from a first height above the first stepped portion to a lowermost layer of the first stacked body on a lower side, and
the second columnar portion penetrates from the first height above the second stepped portion to a lowermost layer of the second stacked body below the third stepped portion, and further, penetrates to the lowermost layer of the lower first stacked body on a lower side.

5. The semiconductor storage device according to claim 3, further comprising
a third columnar portion which is arranged in the second stepped portion and penetrates to the lowermost layer of the first stacked body,
wherein the second columnar portion penetrates from a first height above the second stepped portion to the lowermost layer of the second stacked body below the third stepped portion, and further, penetrates to the lowermost layer of the first stacked body on a lower side, and
the third columnar portion penetrates from the first height above the second stepped portion to the lowermost layer of the second stacked body below the third stepped portion, and further, penetrates to the lowermost layer of first stacked body below the second stepped portion.

6. The semiconductor storage device according to claim 1, further comprising:

a first contact which is arranged at the first stepped portion and connected to the conductive layer; and a second contact which is arranged at the second stepped portion and connected to the conductive layer.

7. The semiconductor storage device according to claim 6, wherein the first contact penetrates from a second height above the first stepped portion to the conductive layer, and the second contact penetrates from the second height above the second stepped portion to the lowermost layer of the second stacked body below the third stepped portion, and further, penetrates to the conductive layer.

8. The semiconductor storage device according to claim 1, further comprising a strip portion which penetrates the first stacked body and the second stacked body, wherein the conductive layers of the first stacked body are in contact with a side surface of the strip portion, and the second insulating layers of the second stacked body are not in contact with the side surface of the strip portion.

9. The semiconductor storage device according to claim 8, wherein the conductive layer of the first stacked body is a layer obtained by being replaced from a fourth insulating layer via the strip portion.

10. The semiconductor storage device according to claim 9, wherein the fourth insulating layer is a layer of an identical type as the second insulating layer of the second stacked body.

* * * * *